(12) United States Patent
Hou et al.

(10) Patent No.: US 8,744,382 B2
(45) Date of Patent: Jun. 3, 2014

(54) FAST TRACKING POWER SUPPLY DEVICE, FAST TRACKING POWER SUPPLY CONTROL METHOD, AND COMMUNICATION EQUIPMENT

(75) Inventors: Zhaozheng Hou, Shenzhen (CN); Xujun Liu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 496 days.

(21) Appl. No.: 12/981,213

(22) Filed: Dec. 29, 2010

(65) Prior Publication Data

US 2011/0191606 A1 Aug. 4, 2011

(30) Foreign Application Priority Data

Jan. 30, 2010 (CN) .......................... 2010 1 0106430

(51) Int. Cl.
*H01Q 11/12* (2006.01)
(52) U.S. Cl.
USPC ........ 455/127.1; 330/127; 330/136; 330/199; 713/300
(58) Field of Classification Search
CPC . H03F 1/0227; H03F 1/025; H03F 2200/102; H03F 2200/432; H03F 2200/507; H03F 2200/511; H03G 3/004; H03G 3/3047
USPC ............... 455/127.1; 330/127, 297, 136, 199; 713/300
See application file for complete search history.

(56) References Cited

U.S. PATENT DOCUMENTS

| | | | |
|---|---|---|---|
| 5,861,777 A * | 1/1999 | Sigmon et al. ................ | 330/136 |
| 6,583,664 B2 | 6/2003 | Mathe et al. | |
| 7,482,869 B2 | 1/2009 | Wilson | |
| 8,253,487 B2 * | 8/2012 | Hou et al. ..................... | 330/127 |
| 2003/0083036 A1 * | 5/2003 | Liu ............................... | 455/343 |
| 2003/0146791 A1 | 8/2003 | Shvarts et al. | |
| 2004/0164800 A1 | 8/2004 | Joffe | |
| 2004/0198271 A1 | 10/2004 | Kang | |
| 2005/0064830 A1 | 3/2005 | Grigore | |
| 2005/0151586 A1 | 7/2005 | Grillo et al. | |

(Continued)

FOREIGN PATENT DOCUMENTS

| | | |
|---|---|---|
| CN | 1421073 A | 5/2003 |
| CN | 1672322 A | 9/2005 |

(Continued)

OTHER PUBLICATIONS

Extended European Search Report dated (mailed) Feb. 4, 2011, issued in related Application No. 10197150.5-1233, Hauwei Technologies Co., Ltd.

(Continued)

*Primary Examiner* — Yuwen Pan
*Assistant Examiner* — Fatuma Sherif
(74) *Attorney, Agent, or Firm* — Conley Rose, P.C.; Grant Rodolph; Nicholas K. Beaulieu

(57) ABSTRACT

A fast tracking power supply device, a fast tracking power supply control method, and communication equipment are provided. The fast tracking power supply device includes: a basic voltage output unit, configured to output a basic voltage; a basic current unit, configured to output a basic current; a linear amplifier, configured to output a compensation current and a compensation voltage, the linear amplifier is connected in parallel with the basic current output unit, and then is connected in series with the basic voltage output unit. The device can output signal with high efficiency and bandwidth.

10 Claims, 8 Drawing Sheets

(56) References Cited

U.S. PATENT DOCUMENTS

| | | | |
|---|---|---|---|
| 2006/0028271 A1* | 2/2006 | Wilson | 330/199 |
| 2007/0279019 A1 | 12/2007 | Wilson | |
| 2008/0157895 A1 | 7/2008 | Immonen et al. | |

FOREIGN PATENT DOCUMENTS

| | | |
|---|---|---|
| CN | 1879070 A | 12/2006 |
| JP | 7311946 A | 11/1995 |
| WO | WO03056698 A2 | 7/2003 |

OTHER PUBLICATIONS

Foreign Communication From a Counterpart Application, Chinese Application 201010106430.3, Chinese Search Report dated Nov. 13, 2012, 2 pages.

Foreign Communication From a Related Counterpart Application, European Patent Application No. 10197150.5, European Office Action dated Jan. 25, 2013, 6 pages.

* cited by examiner

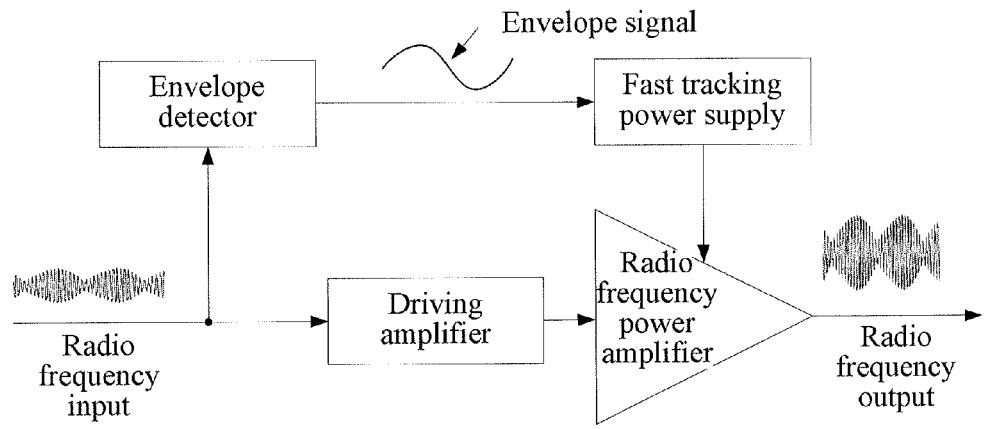
FIG. 1 <Prior Art>
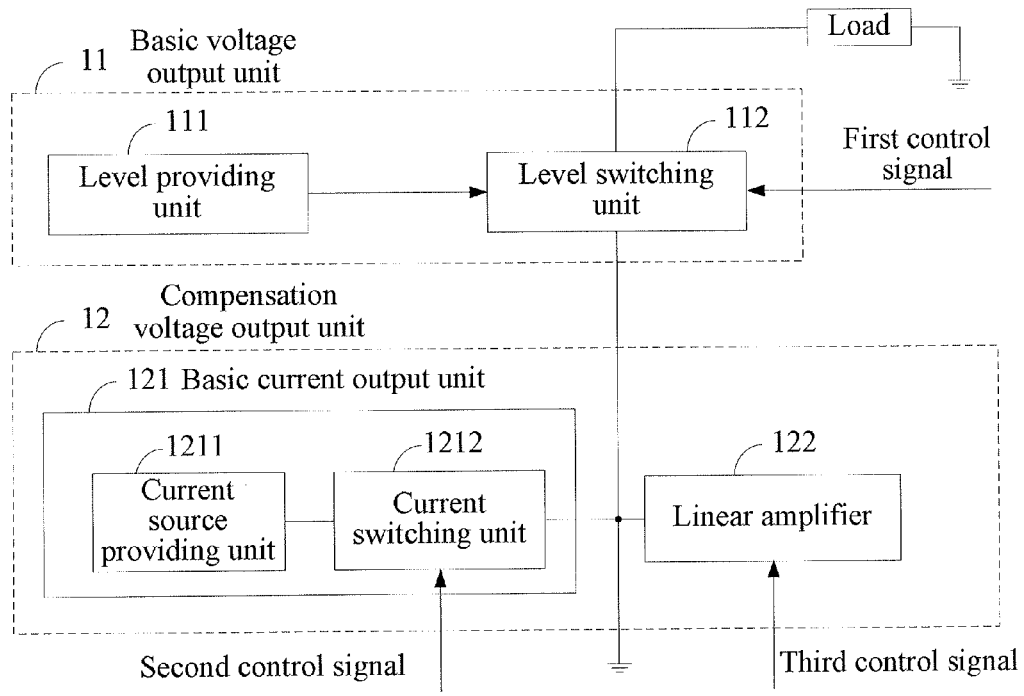
FIG. 2A

FAST TRACKING POWER SUPPLY DEVICE, FAST TRACKING POWER SUPPLY CONTROL METHOD, AND COMMUNICATION EQUIPMENT

CROSS-REFERENCE TO RELATED APPLICATION

This application claims priority to Chinese Patent Application No. 201010106430.3, filed on Jan. 30, 2010, which is hereby incorporated by reference in its entirety.

FIELD OF THE INVENTION

The present invention relates to the field of communication technology, and in particular, to a fast tracking power supply device, a fast tracking power supply control method, and communication equipment.

BACKGROUND OF THE INVENTION

A modern wireless communication system, such as Code Division Multiple Address (CDMA), Wideband Code Division Multiple Address (WCDMA), Universal Mobile Telecommunication System (UMTS), Long Term Evolution (LTE), is a variable envelope modulation technology which sufficiently utilizes frequency spectrum and simultaneously adopts amplitude modulation and phase modulation. The technology has a higher Peak-to-Average Power Ratio (PAPR) and a wider dynamic range, while an excessively high PAPR causes a transmitting end to impose a very high requirement on linearity of a power amplifier and usually to run below an envelope peak level.

The variable envelope modulation technology needs to use a linear power amplifier to amplify a signal, which is realized generally by adopting an Envelope Tracking (ET) based technology in order to guarantee a linearity and increase a power amplification efficiency. As shown in FIG. 1, a radio frequency signal is input, then is driven and amplified by a driving amplifier, and is output to a radio frequency power amplifier. Meanwhile, an envelope detector retrieves an envelope waveform signal of the radio frequency signal, the envelope signal is amplified through a fast tracking power supply, and the amplified envelope signal is used as radio frequency power amplifier drain voltage; and finally the amplified radio frequency signal is output by the radio frequency power amplifier.

With the development of multi-carrier technology, when the fast tracking power supply is linearly amplifying the retrieved envelope signal, a higher requirement is imposed on a bandwidth and an efficiency of the fast tracking power supply. For example, in the procedure of performing envelope amplification, a bandwidth of the envelope signal can be up to dozens of MHz, it is very difficult for a bandwidth of an ordinary switch power supply to satisfy a requirement of an ET bandwidth due to limitation of such factors as a semiconductor technology and a switch frequency. Furthermore, output noise and distortion are modulated to a carrier, which results in out-of-band spectrum spreading and seriously influences an Adjacent Channel Power Ratio (ACPR) of the signal. Hence, a new high efficiency and high bandwidth fast tracking power supply is required to adapt to continuously developing application demands.

SUMMARY OF THE INVENTION

Accordingly, the present invention is directed to a fast tracking power supply device, a fast tracking power supply control method, and communication equipment, which are configured to output a high bandwidth and high efficiency tracking power supply.

An embodiment of the present invention provides a fast tracking power supply device, where the device includes:

a basic voltage output unit, including a level providing unit, configured to provide one or more level outputs; and a level switching unit, configured to switch and select the level output in the level providing unit according to a received first control signal, and output a basic voltage;

a compensation voltage output unit, including a basic current output unit and a linear amplifier;

in which, the linear amplifier is connected in parallel with the basic current output unit, and then is connected in series with the basic voltage output unit;

the basic current output unit includes a current source providing unit, configured to provide one or more constant current sources; and a current switching unit, configured to switch and select the constant current source in the current source providing unit according to a received second control signal, and output a basic current; and the linear amplifier is configured to output a compensation current, and output a compensation voltage according to a third control signal; and the compensation current is configured to compensate the basic current, and the compensation voltage is configured to compensate the basic voltage.

An embodiment of the present invention further provides a fast tracking power supply control method, based on the fast tracking power supply device according to the embodiment of the present invention, where the method includes:

controlling the level switching unit according to a reference signal to switch and select a level output provided in the level providing unit, so as to output a basic voltage;

controlling the current switching unit according to the reference signal to switch and select a current provided in the current providing unit, so as to output a basic current; and controlling the linear amplifier according to the reference signal to output a compensation voltage, and determining a compensation current output by the linear amplifier according to a load current and the basic current, in which the compensation voltage is configured to compensate the basic voltage; and the compensation current is configured to compensate the basic current.

An embodiment of the present invention further provides communication equipment, where the communication equipment includes:

a radio frequency amplification unit, configured to perform radio frequency amplification on a received radio frequency signal; and a processing unit, configured to process the radio frequency signal amplified by the radio frequency amplification unit;

in which, the radio frequency amplification unit includes:

an envelope detector, configured to detect an envelope of the received radio frequency signal, and obtain an envelope signal;

the fast tracking power supply device according to the embodiment of the present invention, configured to receive the envelope signal output by the envelope detector, and amplify the envelope signal;

a driving amplifier, configured to amplify the received radio frequency signal; and a radio frequency power amplifier, configured to receive the envelope signal amplified by the fast tracking power supply and the amplified signal output by the driving amplifier, and amplify the radio frequency signal.

The technical solution has the following advantages.

According to the embodiments of the present invention, the basic voltage output unit outputs a high efficiency, low bandwidth, and low precision signal, and the linear amplifier outputs a low efficiency, high bandwidth, and high precision signal. A high bandwidth and high precision signal is output after the basic voltage output unit and the linear amplifier are connected in series, and the efficiency is higher than the efficiency when only the linear amplifier is used. Meanwhile, the linear amplifier is further connected in parallel with the high efficiency, low bandwidth, and low precision basic current output unit, and the basic current output unit provides the basic current, so the output current of the linear amplifier can be reduced, and the output power of the linear amplifier can be reduced, so that power loss caused by the low output efficiency of the linear amplifier is reduced, so as to further promote the efficiency of the entire fast tracking power supply device.

BRIEF DESCRIPTION OF THE DRAWINGS

To make the technical solution under the present invention clearer, the accompanying drawings for illustrating the embodiments of the present invention or the prior art are outlined below. Apparently, the accompanying drawings are only for the exemplary purpose, and person having ordinary skill in the art can derive other drawings from such accompanying drawings without any creative effort.

FIG. 1 is a schematic view of amplification of a radio frequency signal based on an ET technology in the prior art;

FIG. 2A is a schematic structural view of a fast tracking power supply device according to Embodiment 1 of the present invention;

DETAILED DESCRIPTION OF THE EMBODIMENTS

Figure 2B:
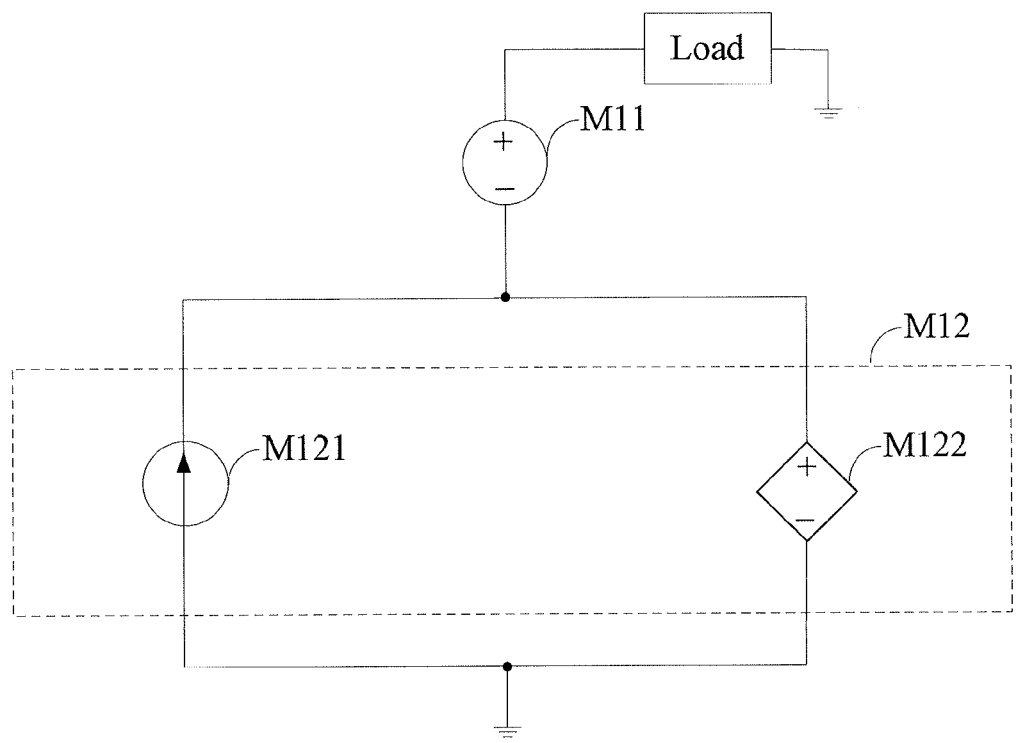
FIG. 2B is an illustrative diagram of an equivalent circuit of the fast tracking power supply device according to Embodiment 1 of the present invention.

For better understanding of the objective, technical solution and merits of the present invention, the present invention is hereinafter described in detail with reference to specific embodiments and relevant accompanying drawings.

Embodiment 1

Embodiment 1 of the present invention provides a fast tracking power supply device. Referring to FIG. 2A, the device includes a basic voltage output unit 11 and a compensation voltage output unit 12.

The basic voltage output unit 11 includes a level providing unit 111, configured to provide one or more level outputs; and a level switching unit 112, configured to switch and select the level output in the level providing unit according to a received first control signal, and output a basic voltage.

The compensation voltage output unit 12 includes a basic current output unit 121 and a linear amplifier 122.

The linear amplifier is connected in parallel with the basic current output unit, and then is connected in series with the basic voltage output unit.

The basic current output unit includes a current source providing unit 1211, configured to provide one or more constant current sources; and a current switching unit 1212, configured to switch and select the constant current source in the current source providing unit according to a received second control signal, and output a basic current.

The linear amplifier 122 is configured to output a compensation current, and output a compensation voltage according to a third control signal; and the compensation current is configured to compensate the basic current, and the compensation voltage is configured to compensate the basic voltage.

Referring to FIG. 2B, the device according to the embodiment of the present invention can be equivalent to a circuit as follows, which includes a first voltage source M11, a second voltage source M122, and a current source M121. The first voltage source M11 is equivalent to the basic voltage output unit 11, which is configured to output the basic voltage. The second voltage source M122 and the current source M121 are equivalent to the compensation voltage output unit 12. The second voltage source M122 is equivalent to the linear amplifier 122, which is configured to output the compensation voltage to compensate the basic voltage; and the current source M121 is equivalent to the basic current output unit 121, which is configured to output the basic current. Meanwhile, the second voltage source M122 is also configured to compensate the basic current.

According to the embodiment of the present invention, what is finally output is an amplified tracking signal, and precision of the basic voltage with is lower than that of a voltage of the finally output tracking signal, so that the basic voltage needs to be compensated and corrected through the compensation voltage. The compensation voltage is realized through the linear amplifier unit (equivalent to a second voltage source in FIG. 3, which can output a high precision signal) in the embodiment of the present invention.

When compensating the basic voltage, the linear amplifier is further connected in parallel with the basic current output unit (equivalent to a current source in FIG. 3), and then is connected in series with the basic voltage for compensation. The basic current unit is configured to provide a main part in an output current, that is, the basic current, and the linear amplifier outputs the compensation current to compensate the basic current. A manner in which the linear amplifier compensates the basic current can be regarded as passive compensation, that is, the linear amplifier does not actively control a current output, and a output thereof is determined by a difference between a load current and a current of the basic current output unit. When the basic current output unit outputs the basic current, the linear amplifier outputs a difference between the basic current and a finally required load current.

The basic voltage and the basic current refer to main parts of the finally output voltage and current; and the compensation voltage and the compensation current are respectively configured to compensate and correct the basic voltage and the basic current, so that a finally output signal is as consistent as possible with an ideal signal to be output.

Figure 2C:
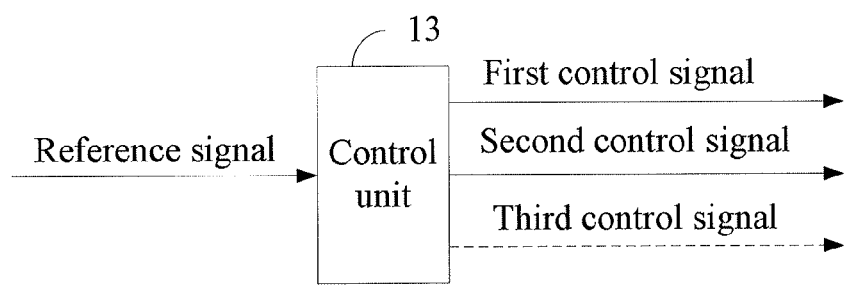
FIG. 2C is a schematic view of a control unit in the fast tracking power supply device according to Embodiment 1 of the present invention.

Referring to FIG. 2C, the device according to the embodiment of the present invention can further include a control unit, which is configured to receive a reference signal, and output the first control signal, the second control signal, and the third control signal according to the received reference signal.

The reference signal of the control unit is from an envelope detector. A voltage and a power of the signal are generally smaller, so that the voltage and the power thereof need to be amplified through the fast tracking power supply device in the embodiment of the present invention. The reference signal can be an analog signal, and also can be a digital signal.

After receiving the reference signal, while outputting a control signal to each unit, the control unit further perform delay-matching of each control signal, so that the output signal of each unit is output at the corresponding time, so as to obtain a precise output signal after superposition.

It is noted that, the third control signal received by the linear amplifier also can be obtained without the control unit, but is obtained directly by the delay-matched reference signal; when the reference signal is the digital signal, because the linear amplifier needs an analog input, the reference signal further needs to be converted into an analog signal through D/A conversion.

In the implementation manner, the control unit can be realized by such processing chips as Digital Signal Processing (DSP) and Field Programmable Gate Array (FPGA) or other processing units having the similar function.

The level providing unit in the basic voltage output unit in the embodiment of the present invention is configured to provide one or more level outputs. For example, isolating power supplies can be adopted to output a level, the isolating power supplies can be formed by using such topologies as Flyback, Forward, Half-Bridge, Push-Pull, and Full-Bridge (but not limited to the listed isolating level topologies), and a structure form thereof can adopt a manner in which the same primary-side transformer couples a multi-branch output or a circuit form in which a plurality of primary-side transformers couples a single branch or multi-branch output.

The level switching unit in the basic voltage output unit includes multiple level selection branches formed by such elements as a switch component, a driving component, and a diode. The switch component is the most important component in the level selection branch, which is configured to switch and select different levels provided by the level providing unit, and the switch component can select such components as a high speed Metal-Oxide-Semiconductor Field-Effect Transistor (MOSFET) or triode. The driving component is configured to provide driving for a switch tube, and may adopt a bootstrap driving component or an isolating driving component according to a practical application case. The diode is configured to prevent different levels from being straight-through and provide reverse prevention. Specific circuit realization of the selection branch is not limited, and a specific circuit is selected to realize the selection branch according to different specific components (such as the triode or the MOSFET).

Through switching and selecting of the level switching unit, a finally output voltage is in a step-like waveform, and a bandwidth thereof is lower.

The basic current output unit in the embodiment of the present invention includes the current source providing unit and the current switching unit. The current source providing unit includes one or more constant current sources. The current switching unit is similar to the level switching unit, and is also formed by multiple current selection branches, and each branch is also formed by such elements as a switch component, a diode, and a driving component. Functions of the components are similar to functions in the level switching unit, and are not recited any more here. The current switching unit switches and selects one constant current source in the current source providing unit as an output of the basic current output unit.

It is noted that, when selecting and outputting a plurality of constant current sources through the current selection branch, the basic current output unit can select a single branch to output, and can also select multiple branches to output.

Through the switching and the selecting of the current switching unit, a waveform of a finally output basic current is similar to that of the basic voltage, which is also a low bandwidth step-like waveform.

In the embodiment of the present invention, the linear amplifier can be an amplifier with a Push-Pull structure, and can be, but is not limited to, a linear amplifier in types of Class A, Class B, and Class AB according to a practical requirement. A linear power tube can be an MOSFET, a triode, or a high frequency power tube with a better frequency characteristic, and in order to increase tracking precision, the linear amplifier further can adopt output feedback control.

A reference level of each unit in the embodiment of the present invention can be selected according to practical application. For example, a reference level of the compensation voltage output unit can be a ground level, and a reference level of the basic voltage output unit can be an output level of the compensation voltage output unit.

Alternatively, the reference level of the basic voltage output unit is the ground level, and the reference level of the compensation voltage output unit is an output level of the basic voltage output unit.

In the embodiment of the present invention, the linear amplifier can output a high precision and high bandwidth signal, but an efficiency thereof is lower. On the contrary, an output efficiency of the basic voltage output unit is very high, but an output signal thereof has a lower bandwidth and a poor precision. According to the embodiment of the present invention, the linear amplifier and the basic voltage output unit are connected in series for performing output, the basic voltage output unit outputs a basic signal (with a high efficiency, a low bandwidth, and a low precision), and the linear amplifier outputs a compensation signal (with a low efficiency, a high bandwidth, and a high precision). A high bandwidth and high precision signal is output after the basic voltage output unit and the linear amplifier are connected in series, and the efficiency is higher than the efficiency when only the linear amplifier is used.

Meanwhile, in the embodiment of the present invention, the linear amplifier is further connected in parallel with the basic current output unit, and the basic current output unit is also a high efficiency, low bandwidth, and low precision output unit, which is configured to output the basic current (occupying a majority of the finally output current), so as to reduce the output current of the linear amplifier and reduce the output power of the linear amplifier, so that power loss caused by the low output efficiency of the linear amplifier is reduced, so as to further promote the efficiency of the entire fast tracking power supply device.

Embodiment 2

Figure 3:
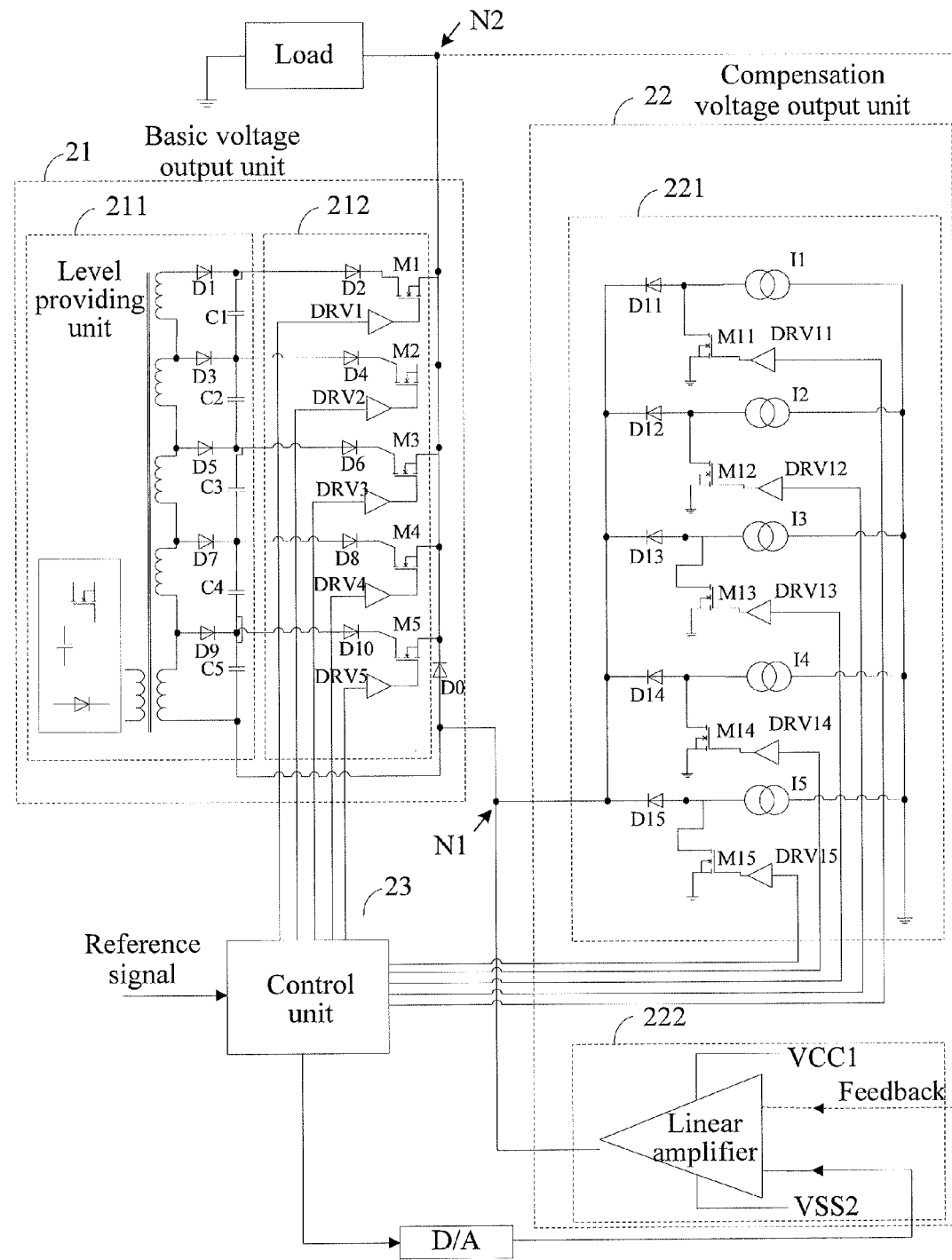
FIG. 3 is a specific implementation circuit diagram of a fast tracking power supply device according to Embodiment 2 of the present invention.

On the basis of Embodiment 1, an embodiment of the present invention provides a fast tracking power supply device. Referring to FIG. 3, the device includes a basic voltage output unit 21 and a compensation voltage output unit 22.

The basic voltage output unit 21 is configured to provide a basic voltage.

The compensation voltage output unit 22 is configured to provide a compensation voltage.

The fast tracking power supply device according to the embodiment of the present invention needs to amplify an output signal and then output the output signal. A voltage of the output signal is divided into two parts, the basic voltage output unit 21 provides one part and outputs the basic voltage. Here, the waveform of the basic voltage is basically similar to that of a target voltage to be output, but the precision thereof is not high. In order to obtain a high precision output voltage, the compensation voltage needs to be output through the compensation voltage output unit for compensation.

Figure 4:
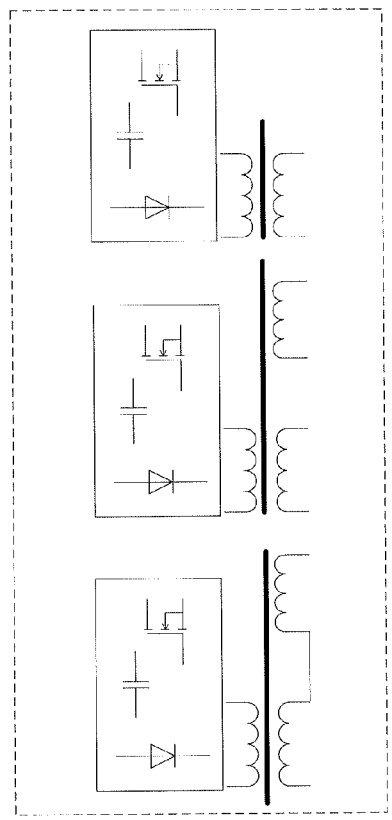
FIG. 4 is a schematic view of the fast tracking power supply device adopting a plurality of isolating power supplies according to Embodiment 2 of the present invention.

Specifically, the basic voltage output unit 21 includes a level providing unit 211 and a level switching unit 212. The level providing unit includes one or more isolating power supplies, and outputs in a transformer coupling manner. FIG. 3 is a schematic view that one isolating power supply is adopted to perform multi-branch output (which is five branches here) in the transformer coupling manner. In an actual application, a plurality of isolating power supplies can also be adopted, and single branch or multi-branch output is performed on each isolating power supply. FIG. 4 is a schematic view that three isolating power supplies are adopted for output. The topmost isolating power supply is in a single branch output form, and the rest two isolating power supplies are in a two-branch output form.

The level switching unit 212 includes multiple selection branches formed by diodes (such as D2 and D4), MOSFETs (such as M1 and M2), and driving components (such as DRV1 and DRV2), and each branch is connected with a single branch output of the level providing unit. For example, according to the embodiment of the present invention, the level providing unit totally has five branches of outputs, and five selection units are set to be respectively connected with the five branches of outputs. The diode is configured to prevent different levels from being straight-through and provide a reverse prevention function. The MOSFET is equivalent to a switch tube and it is configured to select whether to output the branch power supply signal that is connected with the switch tube through a control signal; in a multi-branch case, the MOSFETs are configured to perform multi-branch switching according to the control signal. In an actual application, an MOSFET with a switch speed capable of satisfying performances needs to be selected according to a bandwidth of the signal. The driving component is configured to provide driving for the MOSFET, and a specific form can be a bootstrap driving component or an isolating driving component.

When a certain level needs to be output, the control signal controls conduction of the MOSFET through the driving component, and outputs an output signal of a corresponding isolating power supply. FIG. 5 is a schematic view of voltage output signal waveforms according to an embodiment of the present invention. A curve 10000 is a voltage to be output finally, and a curve 10001 is a voltage output by the basic voltage output unit. It can be seen that, after a corresponding level for output is selected through a level switching circuit, the basic voltage finally output by the basic voltage output unit is a step-like waveform curve.

It is noted that, a form manner of the level switching unit is not unique, and in an actual application, the unit can also be completed through other similar function circuits or integration components having a corresponding function. For example, the MOSFET can also be replaced with such components as a triode, and the present invention is not limited here.

The basic voltage output unit 21 is only capable of outputting a low precision signal in a level switching method. At this time, the output signal of the basic voltage output unit needs to be compensated through the compensation voltage output unit.

Specifically, the compensation voltage output unit 22 includes a basic current output unit 221 and a linear amplifier 222, and the basic current output unit 221 is connected in parallel with the linear amplifier 222 (in FIG. 3, a node N1 is a parallel connection node), and then is connected in series with the basic voltage output unit.

The linear amplifier 222 is connected in parallel with the basic current output unit 221, and is configured to compensate the basic voltage output by the basic voltage output unit; and the basic current output unit 221 is configured to output the basic current, and the linear amplifier 222 also outputs the compensation current simultaneously to compensate the basic current.

In the embodiment of the present invention, after passing through a forward series connection diode D0, an output of the linear amplifier 222 is connected with an output of the basic voltage output unit 21; and the diode D0 is configured to provide a "zero level" for the basic voltage output unit 21, that is, provide a load current channel when the required basic voltage approximates to the zero level.

The linear amplifier can output a high bandwidth and high precision signal (but the efficiency of which is lower), and the input of the linear amplifier is an analog signal. If the received original control signal is a digital signal, digital/analogue (D/A) conversion needs to be performed to convert the digital signal into the analog signal. As shown in FIG. 3, after the D/A conversion, the signal is output to the linear amplifier.

Figure 5A:
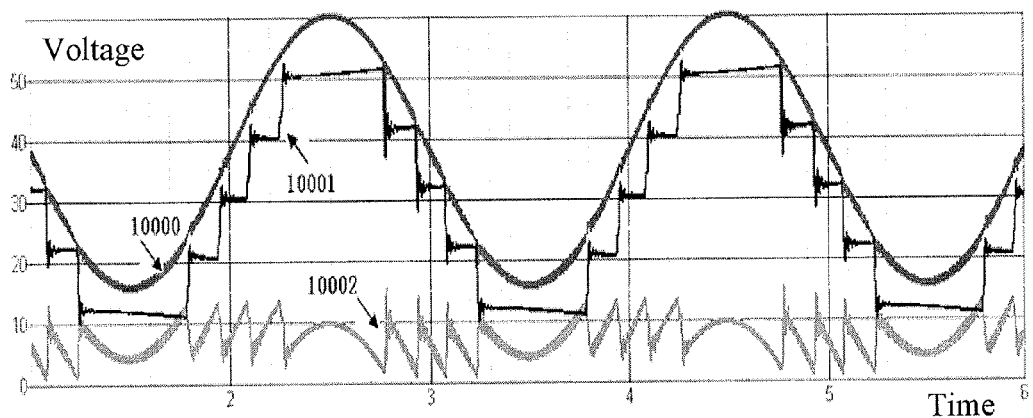
FIG. 5A is a schematic view of voltage output waveforms of units of the fast tracking power supply device according to Embodiment 2 of the present invention.

Referring to FIG. 5A, a waveform of the compensation voltage output by the linear amplifier is shown as a curve 10002. By compensating a basic voltage 10001, a waveform of a finally output signal according to the embodiment of the present invention is shown as a curve 10000.

The basic current output unit includes a plurality of constant current sources and multiple selection branches. As shown in FIG. 3, I1 to I5 are five constant current sources, and each constant current source corresponds to a single branch of selection circuit. For example, a selection circuit corresponding to the constant current source I1 includes a diode D11, an MOSFET M11, and a driving component DRV11. Being similar to the diode in the level switching unit, the diode D11 is configured to prevent different current sources from being straight-through and provide a reverse prevention function. The MOSFET is equivalent to one switch tube, and is configured to determine whether a constant current source selecting the branch performs output. Being similar to the driving component in the level switching circuit, the driving component DRV11 is configured to drive the MOSFET.

Referring to FIG. 3, in the embodiment of the present invention, five current sources and five selection branches are provided. It is noted that, the five branches do not correspond to a certain branch of the basic voltage output unit respectively. In an actual application procedure, outputs of the five current sources can be freely combined to output a required current. For example, the five current sources can output 1 A, 2 A, 3 A, 4 A, and 5 A respectively, the first branch can be controlled to output only, and the output is 1 A; or a second branch and a fourth branch can be controlled to output, the output is 2+4=6 A, or all the five branches are controlled to output, the output is 1+2+3+4+5=15 A.

Figure 5B:
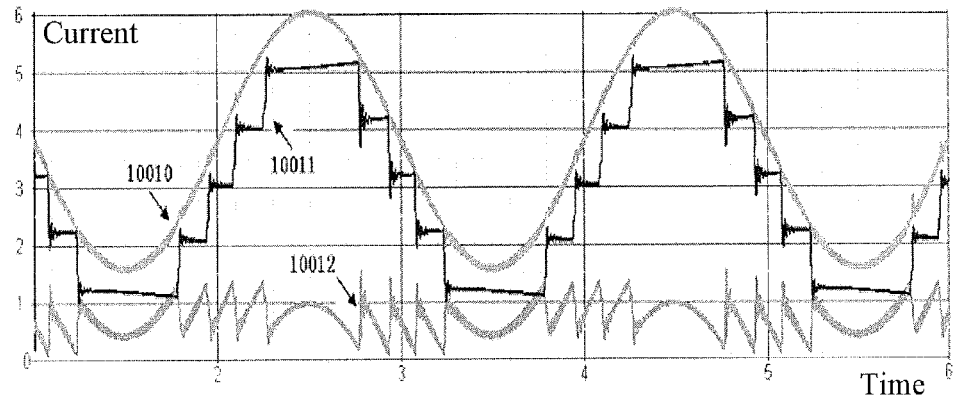
FIG. 5B is a schematic view of current output waveforms of units of the fast tracking power supply device according to Embodiment 2 of the present invention.

Referring to FIG. 5B, a waveform of the output of the basic current output unit is shown as a curve 10011. A curve 10012 shows the compensation current output by the linear amplifier, and a waveform of the finally output current is shown as a curve 10010.

In order to control each unit circuit, the device according to the embodiment of the present invention further includes a control unit 23. The control unit is configured to output a control signal according to an input reference signal to control a voltage selection circuit in the basic voltage output circuit and a current selection circuit in the basic current output circuit. For ease of depiction, the control signal acting on different units (the basic voltage output unit, the basic current output unit, and the linear amplifier) is referred to as a control signal hereinafter uniformly, while is not distinguished as a first/a second/a third control signal.

Here, the reference signal is an envelope signal after being detected by an envelope detector. The envelope signal can be an analog signal, or a digital signal on which the envelope detector performs digitization, and the present invention is not limited here. The control unit controls the basic voltage output unit to output a suitable voltage according to the reference signal; meanwhile also controls the basic current output unit to output a suitable current.

For example, the reference signal received by the control unit is at 10 mV, while a signal finally to be amplified and output is at 22 V. At this time, a certain MOSFET in a level selection circuit in the basic voltage output unit can be switched into conduction, so as to output a level (assumed to be 20 V) corresponding to a selection unit at this branch. Meanwhile, load features are known, so that the current to be output is known too (for example, if a load R=3 ohms, a load current to be output is 20/3=6.6667 A), and one constant current source close to the current to be output can be selected to output (or output after combining a plurality of constant current sources) in a method similar to the level switching circuit. Moreover, in order to obtain the required output signal, the linear amplifier further needs to be controlled to compensate the basic voltage, and finally, output waveforms of voltages and currents of the units are as shown in FIGS. 5A and 5B.

In a procedure of controlling each unit, the control unit further needs to perform delay-matching, so that a level and a current output by each module perform signal superposition at the same moment, so as to obtain a precise output signal.

Figure 6:
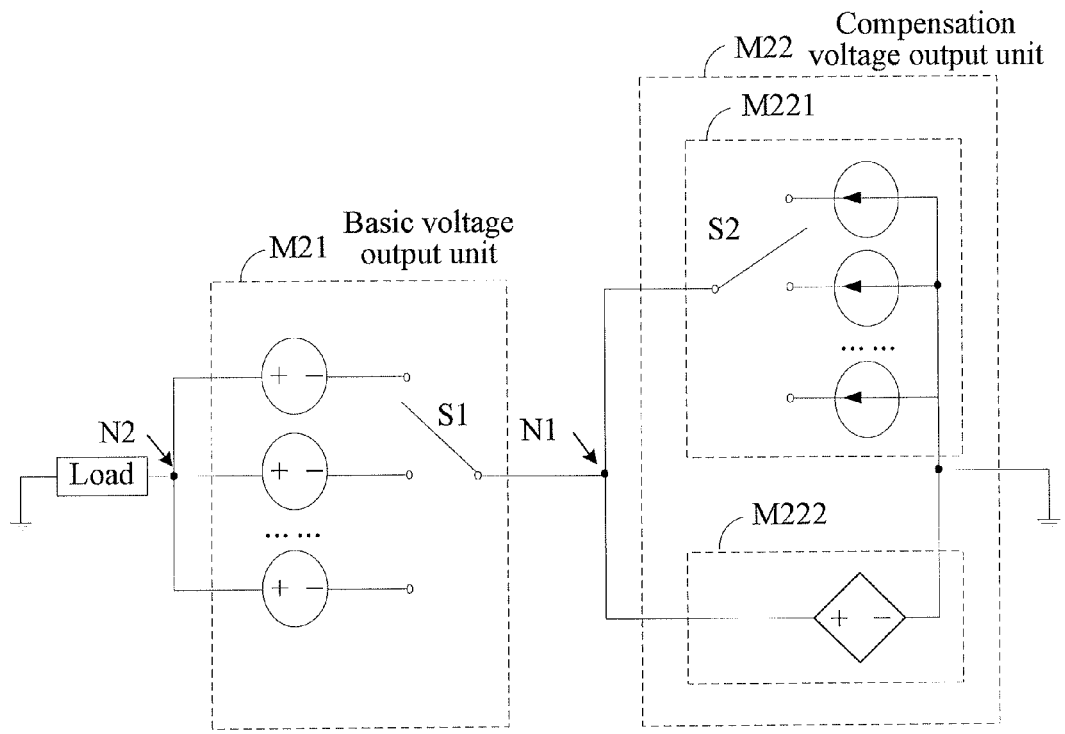
FIG. 6 is an illustrative diagram of an equivalent circuit of the fast tracking power supply device according to Embodiment 2 of the present invention.

FIG. 6 is an illustrative diagram of an equivalent circuit corresponding to FIG. 3 according to the embodiment of the present invention.

An M21 part includes a plurality of voltage sources and one switching switch, and is equivalent to the basic voltage output unit 21 in FIG. 3.

An M22 part includes an M221 and an M222, and is equivalent to the compensation voltage output unit 22 in FIG. 3.

Specifically, the M22 part includes the M221 and the M222. The M221 part includes a plurality of current sources and one switching switch, and is equivalent to the basic current output unit 221 in FIG. 3; and the M222 part is equivalent to the linear amplifier 222 in FIG. 3.

In the circuit shown in FIG. 6, the linear amplifier M222 can output a high bandwidth, high efficiency, and high precision signal (determined by component characters), but an output efficiency thereof is lower; on the contrary, the basic voltage output unit M21 part and the basic current output unit M221 part formed by the switching circuit can output a high efficiency signal, but a bandwidth and a precision thereof is lower. According to the embodiment of the present invention, by connecting the linear amplifier M222 with the basic voltage output unit M21 in series for performing output, not only can demands of a high bandwidth and a high precision be met, but also a system efficiency is not too low.

Meanwhile, in the embodiment of the present invention, the linear amplifier M222 is further connected in parallel with the basic current output unit M221, and an action of the basic current output unit M221 is to promote an efficiency of the entire device. Although the linear amplifier M222 can output a high bandwidth and high precision signal, but an efficiency thereof is lower. However, the basic voltage output unit M21 and the basic current output unit M221 are just on the contrary, a bandwidth and a precision of a signal output by the basic voltage output unit M21 and the basic current output unit M221 are not higher than those of the linear amplifier, but the output efficiency is much higher than that of the linear amplifier M222. A basic current (that is, a majority of current) is provided through the basic current output unit M221, and the linear amplifier M222 can only be allowed to provide a minority of current, so that a proportion of a power of the linear amplifier M222 in an integral output power of the device is reduced, so as to promote the efficiency of the entire device.

Figure 7A:
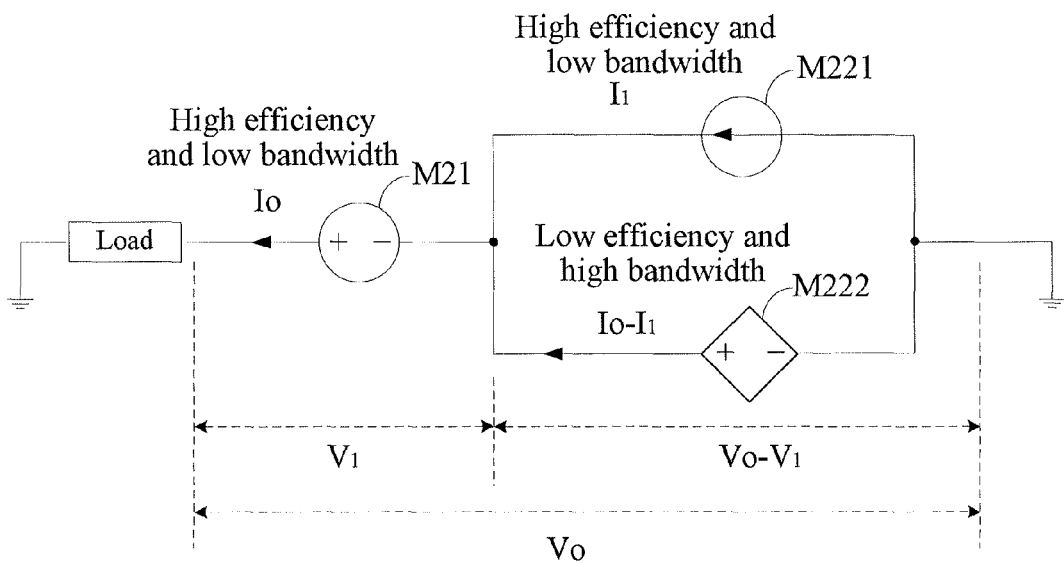
FIG. 7A is an illustrative diagram of another equivalent circuit of the fast tracking power supply device according to Embodiment 2 of the present invention.
Figure 7B:
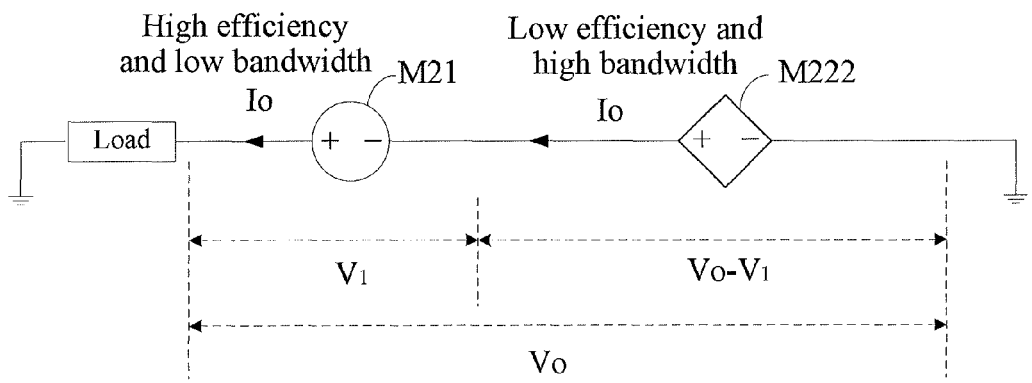
FIG. 7B is an illustrative diagram of an equivalent circuit of the fast tracking power supply device without a basic current output unit according to Embodiment 2 of the present invention.

The action of the parallel connection basic current output unit M211 specifically can be explained with FIGS. 7A and 7B (the M21 part, the M221 part, and the M222 part are simplified and denoted with one voltage source or current source). Load parameters can be determinate during system design, so that, in the embodiment of the present invention, parameters of the finally output voltage and current are also determinate. It is assumed that the finally output voltage is Vo, and the finally output current is Io. Meanwhile, it is assumed that the efficiency of the basic voltage output unit M21 is $\eta_{m1}$, the efficiency of the basic current output unit M221 is $\eta_{m2}$, the efficiency of the linear amplifier M222 is $\eta_n$. $\eta_{m1}$ and $\eta_{m2}$ are higher (which can be up to above 90%); while $\eta_n$ is smaller (which is generally below 40%).

FIG. 7A is an illustrative diagram of an equivalent circuit with a current source connected in parallel with a linear amplifier. It is assumed that the output voltage of the basic voltage unit M21 is V1, and the output current of the basic current output unit M221 is I1; and the output voltage of the linear amplifier M222 is Vo−V1, and the output current of the linear amplifier is Io−I1. In order to finally output the voltage Vo and the current Io, the input power required by the entire device is:

$$\text{Pin\_1} = V1*Io/\eta_{m1} + (Vo-V1)*(Io-I1)/\eta_n + (Vo-V1)*I1/\eta_{m2} \quad (S1)$$

FIG. 7B is an illustrative diagram of an equivalent circuit without a current source connected in parallel with a linear amplifier. It is assumed that the output voltage of the basic voltage unit M21 is V1, and the output voltage of the linear amplifier M222 is Vo−V1. In order to finally output the voltage V0 and the current Io, the input power required by the entire device is:

$$Pin\_2=(V1*Io)/\eta_{m1}+(Vo-V1)*Io/\eta_n \qquad (S2)$$

The S2 formula is transformed. $(Vo-V1)*I1/\eta_n$ is added to the S2 formula and then is subtracted from the S2 formula, so as to obtain $$Pin\_2=V1*Io/\eta_{m1}+(Vo-V1)*(Io-I1)/\eta_n+(Vo-V1)*I1/\eta_n \qquad (S3)$$

It can be known by comparing the S1 formula with the S3 formula that, former two items of these two polynomials are the same, and only last items thereof are different. It can be known by observing the last items of the polynomials, numerators of both are the same, the denominator $\eta_{m2}$ is larger (such as 80% to 90%), and the denominator $\eta_n$ is smaller (such as <40%), therefore:

$$(Vo-V1)*I1/\eta_{m2}<(Vo-V1)*I1/\eta_n;$$

Therefore, the finally input power of the device Pin_1<Pin_2. That is, when the same power is output, a total input power of a device with a current source connected in parallel is smaller than that of a device without a current source connected in parallel. It can be seen that, the embodiment of the present invention further promotes the efficiency of the entire device.

In conclusion, in the embodiment of the present invention, by combining and outputting the series and parallel connection structure of the basic voltage output unit, the basic current output unit, and the linear amplifier, respective features (such as the high bandwidth and the high precision of the linear amplifier; and the high efficiency of the basic voltage output unit and the basic current output unit) are sufficiently utilized, and a high bandwidth, high precision, and high efficiency signal is output, thereby better satisfying application demands of the fast tracking power supply.

Embodiment 3

The embodiment of the present invention makes some adjustment on the basis of Embodiment 2. In Embodiment 2, as shown in FIG. 3, the reference level of the compensation voltage output unit 22 is the ground level, and the output thereof is used as the reference level of the basic voltage output unit 21. The compensation voltage output unit 22 is connected in series with the basic voltage output unit 21, and then is connected with the load.

Figure 8:
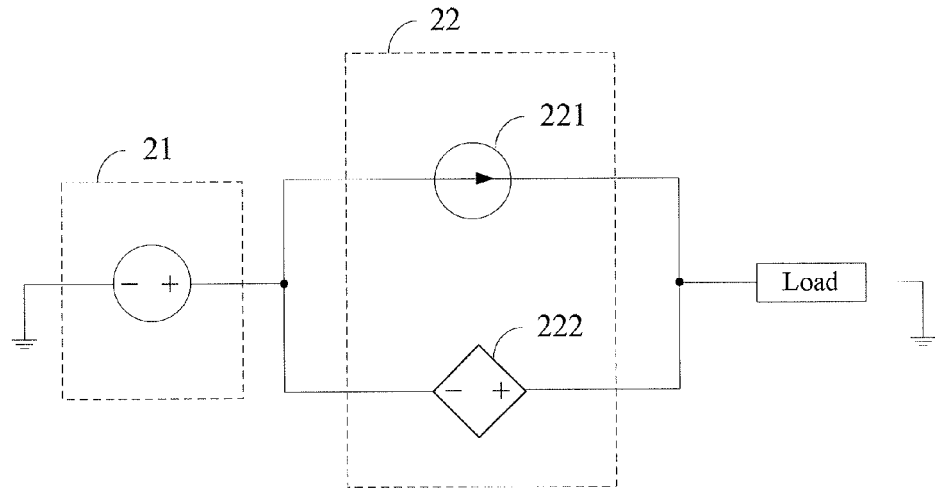
FIG. 8 is an illustrative diagram of an equivalent circuit of a fast tracking power supply device according to Embodiment 3 of the present invention.

FIG. 8 is a schematic illustrative view according to the embodiment of the present invention. A specific implementation manner of the basic voltage output unit 21 and the compensation voltage output unit 22 can refer to the implementation manner in Embodiment 2, and is not recited any more here. In the embodiment of the present invention, the reference level of the basic voltage output unit 21 is the ground level, and the output thereof is used as the reference level of the compensation voltage output unit 22. The basic voltage output unit 21 is connected in series with the compensation voltage output unit 22, and then is connected with the load.

Figure 9:
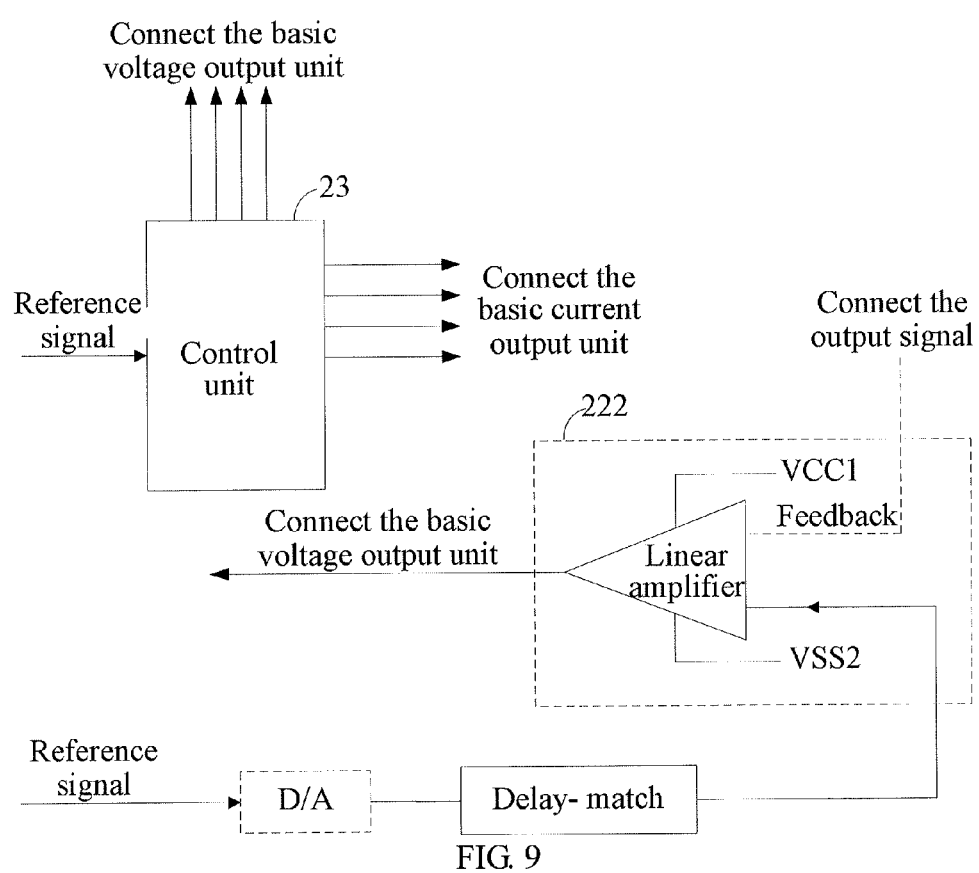
FIG. 9 is a schematic structural view of another fast tracking power supply device according to Embodiment 3 of the present invention.

Moreover, in another embodiment of the present invention, an input control signal of the linear amplifier also can be directly connected with the reference signal, instead of being input after being processed by the control unit. Referring to FIG. 9, the control signal of the linear amplifier according to another embodiment of the present invention is directly output after delay-matching of the reference signal without passing through the control unit. If the reference signal is the digital signal, the reference signal further needs to be converted into the analog signal through the D/A conversion, and then be input to the linear amplifier.

Embodiment 4

Figure 10:
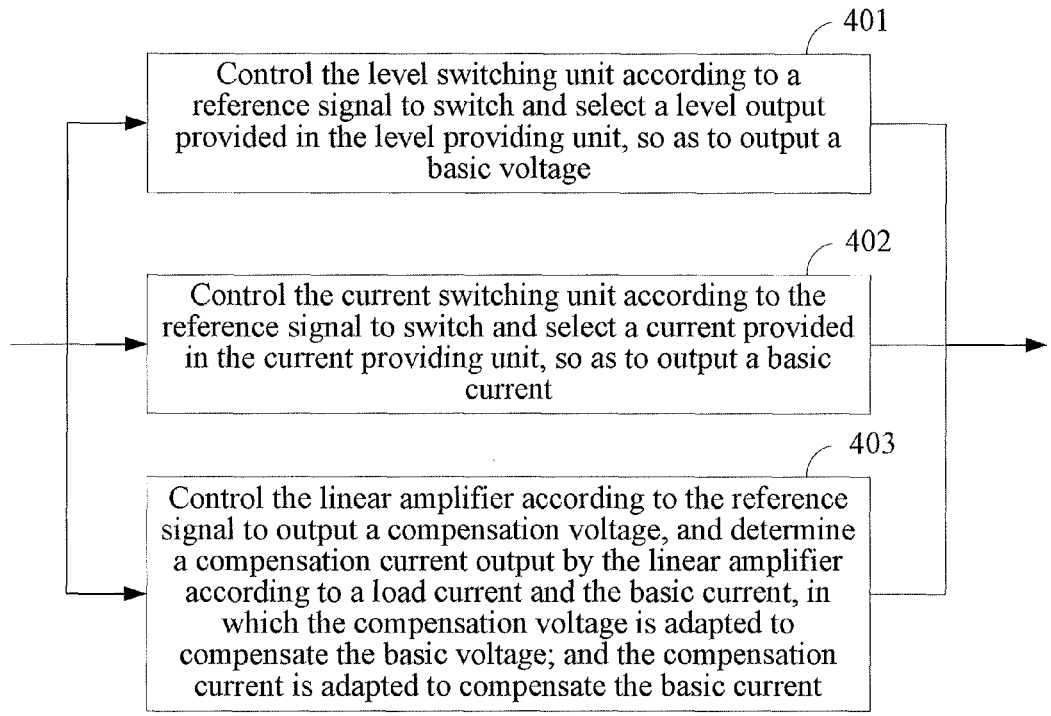
FIG. 10 is a flow chart of a fast tracking power supply control method according to Embodiment 4 of the present invention.

The embodiment of the present invention provides a fast tracking power supply device control method, which is based on the fast tracking power supply device shown in FIG. 2A. A specific implementation form of the device can refer to relevant embodiments in Embodiment 2 and Embodiment 3, and is not recited any more here. Referring to FIG. 10, the fast tracking power supply device control method according to the embodiment of the present invention includes the following steps.

In Step S401, the level switching unit is controlled according to a reference signal to switch and select a level output provided in the level providing unit, so as to output a basic voltage.

In Step S402, the current switching unit is controlled according to the reference signal to switch and select a current provided in the current providing unit, so as to output a basic current.

In Step S403, the linear amplifier is controlled according to the reference signal to output a compensation voltage, and a compensation current output by the linear amplifier is determined according to a load current and the basic current; the compensation voltage is configured to compensate the basic voltage; and the compensation current is configured to compensate the basic current.

Here, the reference signal is a signal output by an envelope detector. A voltage of the signal is generally smaller, such as several millivolts, and needs to be tracked and amplified through a fast tracking circuit, the voltage of the amplified signal is from several volts to dozens of volts. When the fast tracking power supply device according to the embodiment of the present invention is adopted to perform amplification and output, a voltage and a current of a signal are formed by a basic voltage/current and a compensation voltage/current. When a certain voltage/current needs to be output, for example, the reference voltage is 10 mV, a signal to be output after being amplified by the fast tracking power supply is at 22 V and 6.6667 A according to system parameter requirements and load features, the level providing unit can be selected and controlled through the level switching unit, so as to output one basic voltage, such as output one basic voltage of 20 V. Similarly, a current source providing unit is selected and controlled through the current switching unit, so as to output one basic current, such as output one basic current of 6 A. At this time, a certain error still exists between the voltage/current (20 V/6 A) and the voltage/current (22 V/6.6667 A) to be finally output, and the error is compensated by outputting the compensation voltage/current by the linear amplifier.

It is noted that, an executing sequence of the three steps is not strictly required, but at the time of final output, the units of the fast tracking power supply need to output respective signals at the same moment. In an actual application, generally, it is difficult for a high bandwidth signal to directly control the units to simultaneous perform the output through the reference signal, so that delay-matching are further required to enable output signals of the units is output at the corresponding time.

In the embodiment of the present invention, the linear amplifier can output a high bandwidth and high precision signal, but an efficiency thereof is lower. On the contrary, an output efficiency of the basic voltage output unit is very high, but a tracking bandwidth and a tracking precision thereof are lower. According to the embodiment of the present invention, the basic voltage output unit and the linear amplifier are connected in series for performing output, the basic voltage output unit outputs a basic signal (with a high efficiency, a low bandwidth, and a low precision), and the linear amplifier outputs a compensation signal (with a low efficiency, a high bandwidth, and a high precision). A high bandwidth and high precision signal is output after the basic voltage output unit and the linear amplifier are connected in series, and the efficiency is higher than the efficiency when only the linear amplifier is used.

Meanwhile, in the embodiment of the present invention, the linear amplifier is further connected in parallel with the basic current output unit, and the basic current output unit is also one high efficiency, low bandwidth, and low precision output unit, which is configured to output the basic current (occupying a majority of the load current), so as to reduce the output current of the linear amplifier and reduce the output power of the linear amplifier, so that power loss caused by the low output efficiency of the linear amplifier is reduced, so as to further promote the efficiency of the entire fast tracking power supply device.

Embodiment 5

Figure 11:
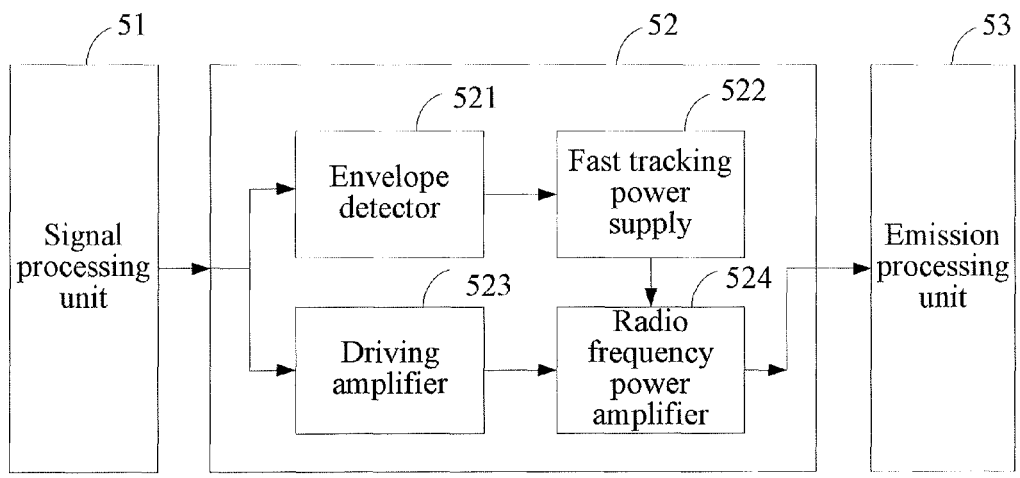
FIG. 11 is a schematic structural view of communication equipment according to Embodiment 5 of the present invention.

The embodiment of the present invention provides communication equipment. Referring to FIG. 11, the communication equipment includes a radio frequency amplification unit 52 and an emission processing unit 53.

The radio frequency amplification unit 52 is configured to perform radio frequency amplification on a received radio frequency signal.

The emission processing unit 53 is configured to perform emission processing on the radio frequency signal amplified by the radio frequency amplification unit.

The radio frequency amplification unit 52 includes an envelope detector 521, a fast tracking power supply 522, a driving amplifier 523, and a radio frequency power amplifier 524.

The envelope detector 521 is configured to detect an envelope of the received radio frequency signal, and obtain an envelope signal.

The fast tracking power supply 522 is configured to receive the envelope signal output by the envelope detector, and amplify the envelope signal. The fast tracking power supply adopts the fast tracking power supply device in Embodiment 1, the specific implementation and the control method thereof can refer to relevant embodiments in Embodiment 2, Embodiment 3, and Embodiment 4, and are not recited any more here.

The driving amplifier 523 is configured to drive and amplify the received radio frequency signal.

The radio frequency power amplifier 524 is configured to receive the envelope signal amplified by the fast tracking power supply and the amplified signal output by the driving amplifier, and amplify the radio frequency signal.

In the embodiment the present invention, the driving amplifier can be regarded as one stage amplification circuit of the entire radio frequency amplification unit 52, and the radio frequency power amplifier can be regarded as another stage amplification circuit.

The communication equipment according to the embodiment of the present invention further includes a signal processing unit 51, which is configured to provide a radio frequency signal for the radio frequency amplification unit.

The communication equipment can be a base station or other communication equipment working together with a radio frequency amplifier.

In the embodiment of the present invention, the linear amplifier in the fast tracking power supply can output a high bandwidth signal, but an efficiency thereof is lower. On the contrary, an output efficiency of the basic voltage output unit is very high, but an output signal thereof has a lower bandwidth. According to the embodiments of the present invention, the basic voltage output unit and the linear amplifier are connected in series for performing output, the basic voltage output unit outputs a basic signal (with a high efficiency, a low bandwidth, and a low precision), and the linear amplifier outputs a compensation signal (with a low efficiency, a high bandwidth, and a high precision). A high bandwidth signal is output after the basic voltage output unit and the linear amplifier are connected in series, and the efficiency is higher than the efficiency when only the linear amplifier is used.

Meanwhile, in the embodiment of the present invention, the linear amplifier is further connected in parallel with the basic current output unit, and the basic current output unit is also a high efficiency, low bandwidth, and low precision output unit, which is configured to output the basic current (occupying a majority of the finally output load current), so as to reduce the output current of the linear amplifier and reduce the output power of the linear amplifier, so that power loss caused by the low output efficiency of the linear amplifier is reduced, so as to further promote the efficiency of the entire fast tracking power supply device.

Persons having ordinary skill in the art may understand that all or part of the steps of the method according to the embodiments of the present invention may be implemented by a program instructing relevant hardware. The program may be stored in a computer readable storage medium. When the program runs, the steps of the method according to the embodiments of the present invention are performed. The storage medium may be a magnetic disk, an optical disk, a read-only memory (ROM), or a random access memory (RAM).

In the preferable embodiments, purposes, technical solutions, and advantages of the present invention are further illustrated in detail. It should be understood that, the above descriptions are merely preferred embodiments of the present invention, but not intended to limit the scope of the present invention. Any modification, equivalent replacement, or improvement made without departing from the spirit and principle of the present invention should fall within the scope of the present invention.

What is claimed is:

1. A fast tracking power supply device, comprising:
  a basic voltage output unit comprising a level providing unit configured to provide one or more level outputs and a level switching unit configured to switch and select the level output in the level providing unit according to a received first control signal and output a basic voltage; and
  a compensation voltage output unit comprising a basic current output unit and a linear amplifier;
  wherein the linear amplifier is connected in parallel with the basic current output unit and is connected in series with the basic voltage output unit,
  wherein the basic current output unit comprises a current source providing unit configured to provide one or more constant current sources and a current switching unit configured to switch and select the constant current source in the current source providing unit according to a received second control signal and output a basic current, wherein the linear amplifier is configured to output a compensation current and output a compensation voltage according to a third control signal, wherein the compensation current is configured to compensate the basic current, and wherein the compensation voltage is configured to compensate the basic voltage.

2. The fast tracking power supply device according to claim 1, further comprising:

a control unit configured to output the first control signal to the basic voltage output unit, output the second control signal to the compensation voltage output unit, and output the third control signal to the linear amplifier according to a reference signal; or a control unit configured to output the first control signal to the basic voltage output unit and output the second control signal to the compensation voltage output unit according to a reference signal.

3. The fast tracking power supply device according to claim 1, wherein the linear amplifier is further configured to output the compensation current according to a difference between the basic current and a load current that requires outputting.

4. The fast tracking power supply device according to claim 1, wherein the level providing unit comprises one or more isolating power supplies, wherein each isolating power supply outputs one level or multiple levels, wherein the level switching unit comprises one or multiple level selection branches, wherein each level selection branch corresponds to the level output by the isolating power supply, and wherein the level selection branch comprises a switch component configured to switch and select one level or multiple levels output by the isolating power supply and output the basic voltage.

5. The fast tracking power supply device according to claim 1, wherein the current switching unit comprises one or multiple current selection branches, wherein each current selection branch comprises a switch component configured to switch and select one constant current source in the current source providing unit as an output of the basic current output unit, and wherein the basic current is output through switching and selection of one or multiple current selection branches.

6. The fast tracking power supply device according to claim 2, wherein the control unit is further configured to perform delay-matching of the first control signal, the second control signal, and the third control signal.

7. The fast tracking power supply device according to claim 2, wherein a reference level of the compensation voltage output unit is a ground level, and a reference level of the basic voltage output unit is an output level of the compensation voltage output unit, or wherein a reference level of the basic voltage output unit is a ground level, and a reference level of the compensation voltage output unit is an output level of the basic voltage output unit.

8. A fast tracking power supply control method comprising:

controlling a fast tracking power supply device, wherein the fast tracking power supply device comprises ut unit and a compensation voltage output unit, wherein the basic voltage output unit comprises a level providing unit configured to provide one or more level outputs and a level switching unit configured to switch and select the level output in the level providing unit according to a received first control signal and output a basic voltage, wherein the compensation voltage output unit comprises a basic current output unit and a linear amplifier, wherein the linear amplifier is connected in parallel with the basic current output unit and is connected in series with the basic voltage output unit, wherein the basic current output unit comprises a current source providing unit configured to provide one or more constant current sources and a switching unit configured to switch and select the constant current source in the current source providing unit according to a received second control signal and output a basic current, and wherein the linear amplifier is configured to output a compensation current and output a compensation voltage according to a third control signal;

wherein the step of controlling the fast tracking power supply device comprises the following steps:

controlling the level switching unit according to the first control a reference signal to switch and select the level output provided in the level providing unit to output the basic voltage;

controlling the current switching unit according to the second control signal to switch and select the constant current source provided in the current source providing unit to output a basic current;

controlling the linear amplifier according to the third control signal to output the compensation voltage, and determining the compensation current output by the linear amplifier according to a load current and the basic current, wherein the compensation voltage is configured to compensate the basic voltage, and wherein the compensation current is configured to compensate the basic current.

9. The fast tracking power supply control method according to claim 8, further comprising performing delay-matching of the first control signal, the second control signal, and the third control signal.

10. Communication equipment, comprising:

a radio frequency amplification unit configured to perform radio frequency amplification on a received radio frequency signal; and an emission processing unit configured to process the radio frequency signal amplified by the radio frequency amplification unit, wherein the radio frequency amplification unit comprises:

an envelope detector configured to detect an envelope of the radio frequency signal and obtain an envelope signal;

a fast tracking power supply device configured to receive the envelope signal output by the envelope detector and amplify the envelope signal, wherein the fast tracking power supply device comprises a basic voltage output unit and a compensation voltage output unit, wherein the basic voltage output unit comprises a level providing unit configured to provide one or more level outputs and a level switching unit configured to switch and select the level output in the level providing unit according to a received first control signal and output a basic voltage, wherein the compensation voltage output unit comprises a basic current output unit and a linear amplifier, wherein the linear amplifier is connected in parallel with the basic current output unit and is connected in series with the basic voltage output unit, wherein the basic current output unit comprises a current source providing unit configured to provide one or more constant current sources and a current switching unit configured to switch and select the constant current source in the current source providing unit according to a received second control signal and output a basic current wherein the linear amplifier is configured to output a compensation current and output a compensation voltage according to a third control signal, wherein the compensation current is configured to compensate the basic current, and wherein the compensation voltage is configured to compensate the basic voltage;

a driving amplifier configured to amplify the received radio frequency signal; and a radio frequency power amplifier configured to receive the envelope signal amplified by a fast tracking power supply and the amplified signal output by the driving amplifier and amplify the radio frequency signal.

* * * * *

UNITED STATES PATENT AND TRADEMARK OFFICE
CERTIFICATE OF CORRECTION

PATENT NO. : 8,744,382 B2
APPLICATION NO. : 12/981213
DATED : June 3, 2014
INVENTOR(S) : Zhaozheng Hou et al.

It is certified that error appears in the above-identified patent and that said Letters Patent is hereby corrected as shown below:

In the claims:

Column 15, Line 61 through Column 16, Line 27, Claim 8, should read as:
"8. A fast tracking power supply control method comprising:
controlling a fast tracking power supply device, wherein the fast tracking power supply device comprises a basic voltage output unit and a compensation voltage output unit, wherein the basic voltage output unit comprises a level providing unit configured to provide one or more level outputs and a level switching unit configured to switch and select the level output in the level providing unit according to a received first control signal and output a basic voltage, wherein the compensation voltage output unit comprises a basic current output unit and a linear amplifier, wherein the linear amplifier is connected in parallel with the basic current output unit and is connected in series with the basic voltage output unit, wherein the basic current output unit comprises a current source providing unit configured to provide one or more constant current sources and a switching unit configured to switch and select the constant current source in the current source providing unit according to a received second control signal and output a basic current, and wherein the linear amplifier is configured to output a compensation current and output a compensation voltage according to a third control signal;
wherein the step of controlling the fast tracking power supply device comprises the following steps: controlling the level switching unit according to the first control signal to switch and select the level output provided in the level providing unit to output the basic voltage;
controlling the current switching unit according to the second control signal to switch and select the constant current source provided in the current source providing unit to output a basic current;"

Column 16, Lines 28-36, Claim 8, should read as:
"controlling the linear amplifier according to the third control signal to output the compensation voltage, and
determining the compensation current output by the linear amplifier according to a load current and the basic current,
wherein the compensation voltage is configured to compensate the basic voltage, and
wherein the compensation current is configured to compensate the basic current."

Signed and Sealed this
Twenty-first Day of October, 2014

Michelle K. Lee
*Deputy Director of the United States Patent and Trademark Office*